United States Patent
Meiser

(10) Patent No.: US 9,614,064 B2
(45) Date of Patent: Apr. 4, 2017

(54) SEMICONDUCTOR DEVICE AND INTEGRATED CIRCUIT

(71) Applicant: Infineon Technologies AG, Neubiberg (DE)

(72) Inventor: Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/673,072

(22) Filed: Mar. 30, 2015

(65) Prior Publication Data

US 2015/0279978 A1 Oct. 1, 2015

(30) Foreign Application Priority Data

Apr. 1, 2014 (DE) .................. 10 2014 104 589

(51) Int. Cl.
| | | |
|---|---|---|
| H01L 29/78 | (2006.01) | |
| H01L 29/735 | (2006.01) | |
| H01L 29/06 | (2006.01) | |
| H01L 29/417 | (2006.01) | |
| H01L 29/423 | (2006.01) | |
| H01L 29/808 | (2006.01) | |
| H01L 29/40 | (2006.01) | |
| H01L 29/10 | (2006.01) | |

(52) U.S. Cl.
CPC ........ *H01L 29/735* (2013.01); *H01L 29/0657* (2013.01); *H01L 29/407* (2013.01); *H01L 29/41708* (2013.01); *H01L 29/41766* (2013.01); *H01L 29/4236* (2013.01); *H01L 29/42304* (2013.01); *H01L 29/7816* (2013.01); *H01L 29/7825* (2013.01); *H01L 29/808* (2013.01); *H01L 29/1066* (2013.01)

(58) Field of Classification Search
CPC ............. H01L 29/1095; H01L 29/4236; H01L 29/7825; H01L 29/7816; H01L 29/66681; H01L 29/66704; H01L 29/66696
See application file for complete search history.

(56) References Cited

U.S. PATENT DOCUMENTS

| | | | |
|---|---|---|---|
| 2003/0141514 A1* | 7/2003 | Yamaguchi | H01L 29/66348 257/107 |
| 2006/0001085 A1 | 1/2006 | Risaki | |
| 2006/0076621 A1* | 4/2006 | Hirler | H01L 29/0634 257/343 |
| 2008/0203472 A1 | 8/2008 | Tamura | |

(Continued)

*Primary Examiner* — Yu Chen
(74) *Attorney, Agent, or Firm* — Murphy, Bilak & Homiller, PLLC

(57) ABSTRACT

A semiconductor device includes a transistor in a semiconductor substrate having a main surface. The transistor includes a source region, a drain region, a body region, and a gate electrode structure adjacent to the body region. The source region and the drain region are disposed along a first direction, the first direction being parallel to the main surface. The body region is disposed between the source region and the drain region. The body region includes an upper body region at the main surface and a lower body region remote from the main surface. A first width of the lower body region is smaller than a second width of the upper body region. The first width and the second width are measured in a direction perpendicular to the first direction.

17 Claims, 11 Drawing Sheets

(56) References Cited

U.S. PATENT DOCUMENTS

| | | | |
|---|---|---|---|
| 2011/0241113 A1* | 10/2011 | Zuniga | H01L 29/402 257/343 |
| 2013/0105887 A1* | 5/2013 | Zuniga | H01L 29/66704 257/330 |
| 2014/0034999 A1* | 2/2014 | Korec | H01L 29/7393 257/140 |

* cited by examiner

US 9,614,064 B2

SEMICONDUCTOR DEVICE AND INTEGRATED CIRCUIT

PRIORITY CLAIM

This application claims priority to German Patent Application No. 10 2014 104 589.0 filed on 1 Apr. 2014, the content of said application incorporated herein by reference in its entirety.

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which current flow mainly takes place parallel to a main surface of a semiconductor substrate, are useful for semiconductor devices in which further components, such as switches, bridges and control circuits are integrated.

In addition, there are specific requirements regarding the electrical SOA ("safe operating area"). This applies on one side to the linear operation region at higher gate voltages as well as to the resistance to avalanche breakdown at a gate-source voltage of 0 V. In particular, it is desirable to suppress a parasitic bipolar transistor, since the activation of a parasitic bipolar transistor might result in a destruction of the semiconductor device due to the generation of current filaments.

SUMMARY

According to an embodiment of a semiconductor device comprising a transistor in a semiconductor substrate including a main surface, the transistor comprises a source region, a drain region, a body region, and a gate electrode structure adjacent to the body region. The source region and the drain region are disposed along a first direction which is parallel to the main surface. The body region is disposed between the source region and the drain region. The body region comprises an upper body region at the main surface and a lower body region remote from the main surface, a first width of the lower body region being smaller than a second width of the upper body region, the first width and the second width being measured in a direction perpendicular to the first direction.

According to another embodiment of a semiconductor device comprising a transistor in a semiconductor substrate including a main surface, the transistor comprises a source region, a drain region, a body region including a channel region, a gate electrode structure adjacent to the body region, and a body contact portion in contact with the body region. The source region and the drain region are disposed along a first direction, the first direction being parallel to the main surface. The body region is disposed between the source region and the drain region. The body region has a shape of a fin extending along the first direction, the fin having a top side at the main surface and two sidewalls. The body contact portion contacts the top side of the fin.

According to yet another embodiment of a semiconductor device comprising a transistor in a semiconductor substrate including a main surface, the transistor comprises a source region, a drain region, a body region disposed between the source region and the drain region, a gate electrode structure adjacent to the body region, and a body contact portion in contact with a top surface of the body region. The body contact portion is electrically coupled to a source terminal. The top surface is disposed on a side of the main surface of the semiconductor substrate. The source region and the drain region are disposed along a first direction, the first direction being parallel to the main surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate the main embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1A:
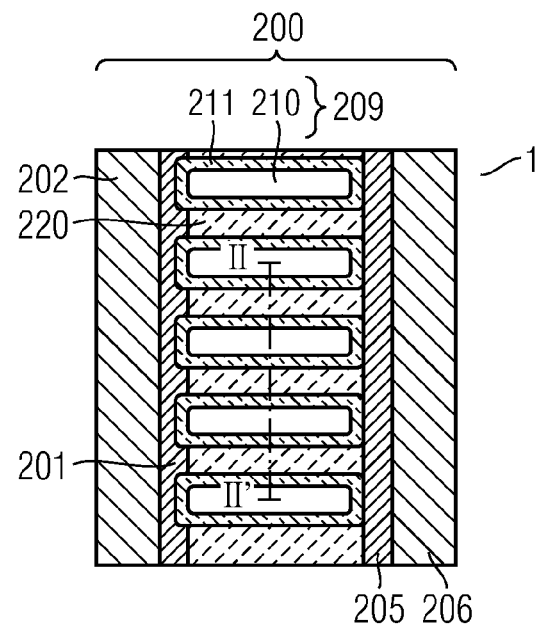
FIG. 1A shows a cross-sectional view of a semiconductor device according to an embodiment in a plane parallel to a main surface of a semiconductor substrate.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

Embodiments are described while specifically referring to so-called normally-off transistors, i.e. transistors which are in an off-state when no gate voltage or a gate voltage of 0V is applied. As is to be clearly understood, the present teaching can be equally applied to normally-on transistors, i.e. transistors which are in a conducting state when no gate voltage or a gate voltage of 0V is applied.

FIG. 1A shows a cross-sectional view of a semiconductor device 1 or an integrated circuit which is taken in a plane parallel to main surface of a semiconductor substrate. The semiconductor device 1 comprises a transistor 200 in a semiconductor substrate including a main surface. The transistor 200 comprises a source region 201, a drain region 205 and a body region 220. The transistor further comprises a gate electrode structure 209 that is adjacent to the body region 220. For example, the gate electrode structure 209 may comprise a gate dielectric 211 and a gate electrode 210, the gate dielectric 211 being disposed between the gate electrode 210 and the body region 220. The source region 201 and the drain region 205 are disposed along a first direction, the first direction being parallel to the main surface. The body region 220 is disposed between the source region 201 and the drain region 205.

Figure 1B:
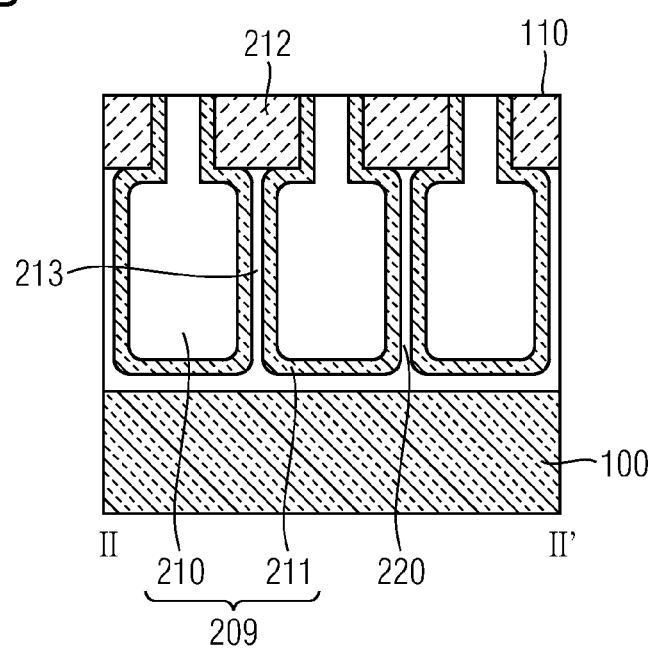
FIG. 1B shows a further cross-sectional view of the semiconductor device shown in FIG. 1A.

FIG. 1B shows a cross-sectional view between II and II' as is also indicated in FIG. 1A, showing the semiconductor substrate 100 and the main surface 110. As is specifically illustrated in FIG. 1B, the body region 220 comprises an upper body region 212 at the main surface 110 and a lower body region 213 remote from the main surface 110. A first width of the lower body region 213 is smaller than a second width of the upper body region 212. The first width and the second width are measured in a direction perpendicular to the first direction. According to an embodiment, the source region 201 may be electrically coupled to the source electrode 202. The drain region 205 may be electrically coupled to the drain electrode 206. According to implementations, the source electrode 202 and the drain electrode 206 may be disposed in respective contact trenches extending perpendicularly with respect to the first direction.

Figure 1C:
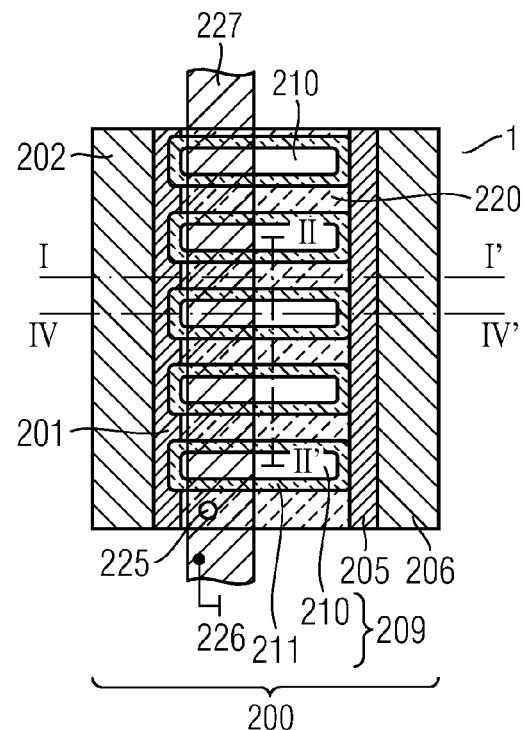
FIG. 1C shows a cross-sectional view of a semiconductor device according to a further embodiment in a plane parallel to a main surface of a semiconductor substrate.
Figure 1D:
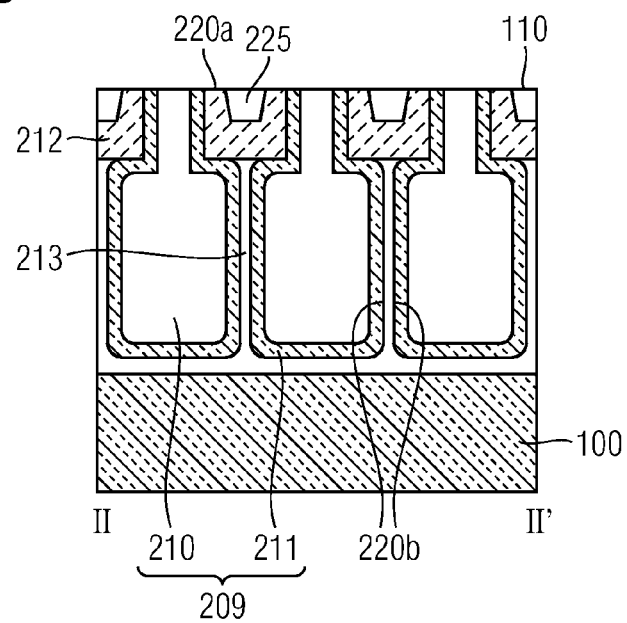
FIG. 1D shows a further cross-sectional view of the semiconductor device shown in FIG. 1C.

FIGS. 1C and 1D illustrate elements of a semiconductor device according to further embodiments. As is shown in FIGS. 1C and 1D, a semiconductor device 1 comprises a transistor 200 in a semiconductor substrate 100 including a main surface 110. The transistor 200 comprises a source region 201, a drain region 205, a body region 220, the body region 220 being disposed between the source region 201 and the drain region 205. The transistor further comprises a gate electrode structure 209 adjacent to the body region 220. The gate electrode structure 209 may comprise a gate electrode 210 and a gate dielectric 211 disposed between the gate electrode 210 and the body region 220. The transistor 200 further comprises a body contact portion 225 in contact with a top surface of the body region 220, the body contact portion being electrically coupled to a source terminal 226. The top surface of the body region is disposed on a side of the main surface 110 of the semiconductor substrate 100. The source region and the drain region 201, 205 are disposed along a first direction, the first direction being parallel to the main surface 110. According to the embodiment shown in FIG. 1C, the body contact portion is electrically coupled to a source terminal 226 via a source connection wiring 227. However, according to further embodiments, this electrically connection may be implemented in an alternative manner.

FIGS. 1C and 1D show cross-sectional views of a semiconductor device according to still a further embodiment. The semiconductor device 1 shown in FIGS. 1C and 1D comprises a transistor 200 in a semiconductor substrate 100 including a main surface 110. The transistor 200 comprises a source region 201, a drain region 205 and a body region 220. The body region 220 includes a channel region 213. The transistor further comprises a gate electrode structure 209. For example, the gate electrode structure 209 may comprise a gate dielectric 211 and a gate electrode 210, the gate dielectric 211 being disposed between the gate electrode 210 and the body region 220. The semiconductor device further comprises a body contact portion 225 in contact with the body region 220. The source region 201 and the drain region 205 are disposed along a first direction that is parallel to the main surface 110. The body region 220 is disposed between the source region 201 and the drain region 205. The body region 220 has a shape of a fin extending along the first direction. The fin has a top side 220a at the main surface 110 and to sidewalls 220b. The body contact portion 225 contacts the top side 220a of the fin.

When a suitable voltage is applied to the gate electrode 210, an inversion layer is formed at the boundary between the body region 220 and the gate electrode structure 209. Accordingly, the transistor 200 is in a conducting state from the source region 201 to the drain region 205. The conductivity of the channel that is defined in the body region 220 is controlled by the gate electrode forming a component of the gate electrode structure 209. By controlling the conductivity of the channel formed in the body region 220, the current flow from the source region 201 via the channel formed in the body region 220 to the drain region 205 may be controlled. When the transistor is switched off, no conductive channel is formed at the boundary between the body region 220 and the gate electrode structure 209 so that a sub-threshold current flows.

Due to the specific structure illustrated in FIGS. 1B and 1D, according to which the first width of the lower body region is smaller than the second width of the upper body region, the upper body region may be easily contacted and the upper body region may have a low resistance value. In addition, due to the small first width, the lower body region may be fully depleted by applying suitable gate voltage to the gate electrodes 210. Hence, the semiconductor device is optimized in view of the channel width which is determined by the first width and the width of the upper body region which enables low-ohmic contacts to the body region. In particular, the structure illustrated in FIGS. 1A to 1D enables body contact portions having a low resistivity. Thereby a low-ohmic contact of the body region to a source terminal is enabled and a parasitic bipolar transistor may be deteriorated or suppressed.

Figures 2A, 2B:
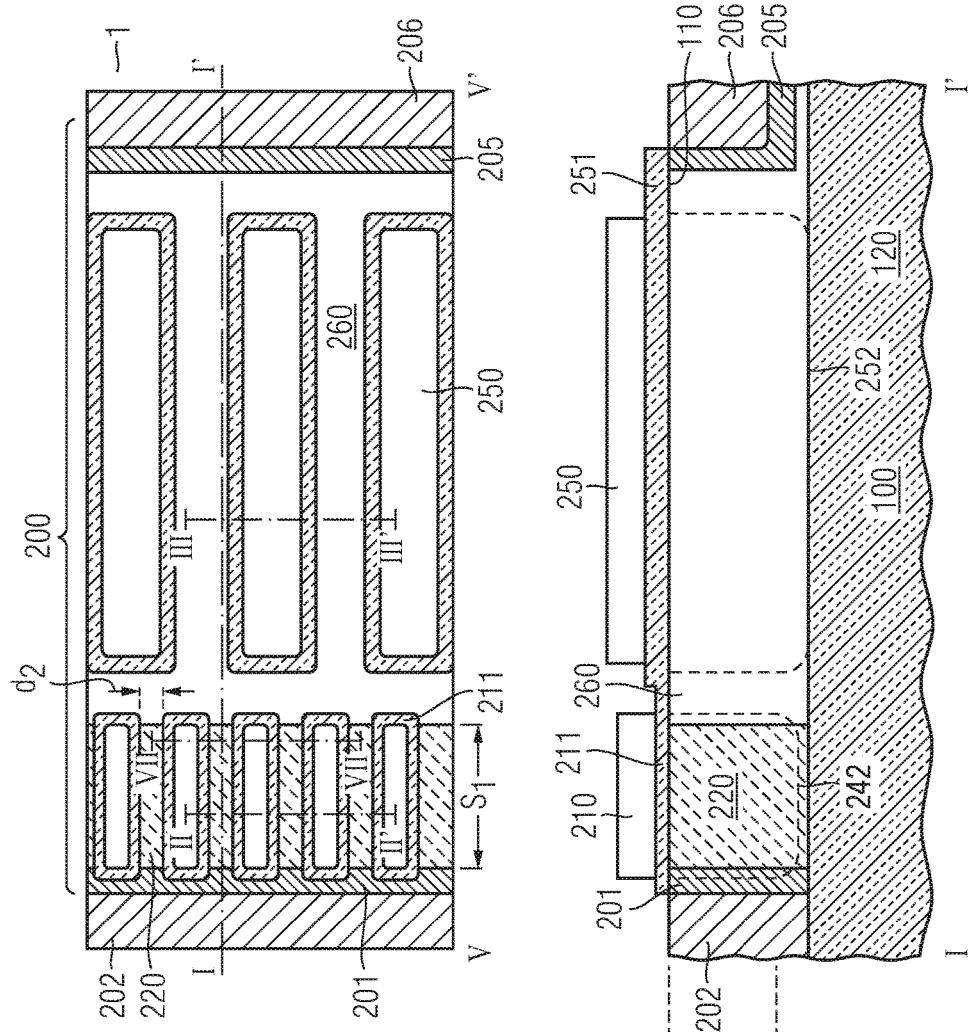
FIG. 2A shows a cross-sectional view of a semiconductor device according to a further embodiment in a plane parallel to a main surface of a semiconductor substrate.
FIG. 2B shows a first cross-sectional view of the semiconductor device shown in FIG. 2A.
Figure 2C:
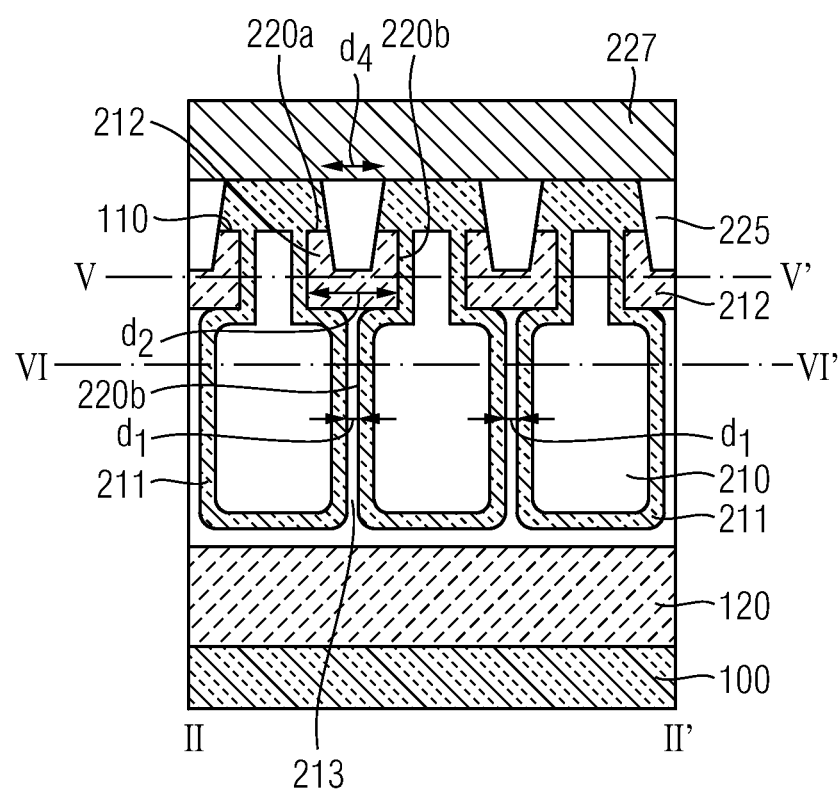
FIG. 2C shows a cross-sectional view of the semiconductor device shown in FIG. 2A in a direction perpendicular to the direction of the cross-sectional view of FIG. 2B.

FIG. 2A shows a cross-sectional view of a semiconductor device 1 or an integrated circuit according to a further embodiment. The cross-sectional view of FIG. 2A is taken between V and V' as is also indicated in FIG. 2C, in other words, the cross-sectional view of FIG. 2A is taken close to the main surface of the semiconductor substrate.

The semiconductor device 1 includes a transistor 200. The transistor 200 shown in FIG. 2A comprises a source region 201, a drain region 205, a body region 220, and a drift zone 260. The source region 201, the drain region 205 and the drift zone 260 may be doped with dopants of a first conductivity type, for example n-type dopants. The doping concentration of the source and the drain regions 201, 205 may be higher than the doping concentration of the drift zone 260. The body region 220 is arranged between the source region 201 and the drift zone 260. The body region 220 is doped with dopants of a second conductivity type, for example with p-type dopants. The drift zone 260 may be arranged between the body region 220 and the drain region 205. The source region 201, the body region 220, the drift zone 260 and the drain region 205 are disposed along a first direction parallel to a main surface 110 of the semiconductor substrate 100. The source region 201 is connected to the source electrode 202. The drain region 205 is connected to the drain electrode 206. The semiconductor device 1 further comprises a gate electrode structure 209. The gate electrode structure 209 may comprise a gate electrode 210 that may be insulated from the body region 220 by means of an insulating gate dielectric material 211 such as silicon oxide. According to further implementations, the gate electrode structure 209 does not comprise a gate dielectric layer and the device may implement a JFET ("junction field effect transistor"), for example. According to an embodiment, the transistor may further comprise a field plate 250 which is arranged adjacent to the drift zone 260. The field plate 250 is insulated from the drift zone 260 by means of an insulating field dielectric layer 251 such as silicon oxide. The transistor 200 is a lateral transistor. Accordingly, a current flow from the source region 201 to the drain region 205 is mainly accomplished in the first direction parallel to the main surface of the semiconductor substrate.

When a suitable voltage is applied to the gate electrode 210, an inversion layer is formed at the boundary between the body region 220 and the insulating gate dielectric material 211. Accordingly, the transistor is in a conducting state from the source region 201 to the drain region 205 via the drift zone 260. The conductivity of the channel that is formed in the body region 220 is controlled by the gate electrode. By controlling the conductivity of the channel formed in the channel region, the current flow from the source region 201 via the channel formed in the body region 220 and the drift zone 260 to the drain region 205 may be controlled.

When the transistor is switched off, no conductive channel is formed at the boundary between the body region 220 and the insulating gate dielectric material 211 so that a sub-threshold current flows.

According to an embodiment, the transistor may be implemented as a normally-off transistor. According to a further embodiment, the transistor may be implemented as a normally-on transistor. In this case, the body region 220 may be doped with dopants of the first conductivity type, for example, with n-type dopants.

An appropriate voltage may be applied to the field plate in an off-state. For example, the field plate 250 may be electrically coupled to a source terminal, which is also electrically coupled to a source electrode 202. In an off-state, the field plate 250 depletes charge carriers from the drift zone 260 so that the breakdown voltage characteristics of the transistor 200 are improved. In a transistor 200 comprising the field plate 250 the doping concentration of the drift zone 260 may be increased without deteriorating the breakdown voltage characteristics in comparison to a device without a field plate. Due to the higher doping concentration of the drift zone, the on-resistance $RDS_{on}$ is further decreased resulting in improved device characteristics.

FIG. 2B illustrates a cross-sectional view of the semiconductor device 1 between I and I' along the first direction, as is also indicated in FIG. 2A. The cross-sectional view of FIG. 2B is taken so as to intersect the body region 220 and the drift zone 260. As is indicated by dotted lines, gate trenches 242 are disposed adjacent to the body region 220 in a plane before and behind the depicted plane of the drawing. Further, field plate trenches 252 may be disposed adjacent to the drift zone 260 in a plane before and behind the depicted plane of the drawing. The gate trench 242 and the field plate trench 252 extend from the main surface 110 in a depth direction of the substrate 100. As a consequence, the gate electrode is adjacent to at least two sides, e.g. opposing sides, of the body region 220. Further, the body region 220 has the shape of a first ridge. Due to the presence of the field plate trenches 252, according to an embodiment, the drift zone 260 may have the shape of a second ridge.

The source region 201 extends from the main surface 110 into a depth direction of the substrate 100, i.e. perpendicularly with respect to the main surface 110. The drain region 205 likewise extends from the main surface 110 in a depth direction of the substrate 100.

FIG. 2C illustrates a cross-sectional view of the semiconductor device which is taken between II and II' as is also indicated in FIG. 2A. The direction between II and II' is perpendicular to the first direction. As is shown in FIG. 2C, the body region 220 has the shape of a ridge or a fin. For example, the ridge may have a top side 220a, and first and second sidewalls 220b.

As is further shown in FIG. 2C, the body region 220 comprises a lower body region 213 having a first width d1, and an upper body region 212 having a second width d2, the first and the second width being measured in the direction of i.e. perpendicularly to the first direction.

When the semiconductor device 1 is operated in an on-state, conductive inversion layers are formed along the first and second sidewalls 220b.

According to an embodiment, the width d1 of the lower body region 220 fulfills the following relationship: $d1 \leq 2*l_d$, wherein $l_d$ denotes a length of a depletion zone which is formed at the interface between the gate dielectric layer 211 and the body region 220. For example, the maximum width of the depletion zone may be determined as:

$$a.\ l_d = \sqrt{\frac{4\varepsilon_s kT \ln(N_A/n_i)}{q^2 N_A}}$$

wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature, ln the denotes the natural logarithm, $N_A$ denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 20 to 400 nm, for example, 40 to 120 nm along the main surface 110 of the semiconductor substrate 100.

Moreover, the ratio of length to width may fulfill the following relationship: $s_1/d_1 > 2.0$, wherein s1 denotes the length of the first ridge overlapping with the gate electrode 210, or, differently stated, the length of the channel region, measured along the first direction, as is also illustrated in FIG. 2A. According to further embodiments, $s_1/d_1 > 2.5$.

According to the embodiment in which the width $d1 \leq 2*l_d$, a part of the transistor 200 is a so-called "fully-depleted" transistor in which the lower body region 213 is fully depleted when the gate electrode 210 is set to an on-voltage. In such a transistor, an optimal sub-threshold voltage may be achieved and short channel effects may be efficiently suppressed, resulting in improved device characteristics.

The upper body region 212 implements a body connect implantation region. The body contact portion is configured to electrically couple the body region 220 to the source terminal. Thereby, a parasitic bipolar transistor may be deteriorated or suppressed. The upper body region 212 may be doped with dopants of the second conductivity type at a higher concentration than the lower body region 213. For example, the impurity concentration of dopants of the second conductivity type of the upper body region 212 may exceed the impurity concentration of dopants of the lower body region 213 by 50% or more, for example, by 100% or more. By correspondingly setting the impurity concentration of the upper body region 212, the threshold voltage in the upper body region 212 may be set to optimize the device characteristics. For example, the threshold voltage in the upper body region 212 may be set so that at a certain gate voltage a transistor comprising the upper body region 212 is not set to an on-state whereas the transistor comprising the lower body region 213 is set to an on-state. For example, the depth t2 of the upper body region 213 may be less than 1 μm.

The upper body region 212 has a second width d2 that is larger than the first width d1. As a consequence, source contacts 225 for electrically coupling the upper body region 212 to a source connection wiring 227 may be formed to have a fourth width d4. For example, the fourth width d4 may be larger than the first width of the lower body region 220. Due to the larger width d2 of the upper body region 212 compared with d1 of the lower body region 213, the alignment of the source contacts 225 may be improved. Moreover, the fourth width of the source contacts 225 may be set to a value that reduces the resistance of the contact between source connection wiring 227 and body region 220. As a result, the parasitic bipolar transistor may be further deteriorated or suppressed resulting in improved device characteristics. For example, the second width d2 may be at least the twofold of the first width d1. According to a specific example, d2 may be at least 140 nm.

As is further shown in FIG. 2C, the gate electrode 210 may be disposed in gate trenches 242. The body region 220 may be disposed between adjacent gate trenches 242. The gate trenches have a larger width in a lower portion thereof than in a portion which is adjacent to the main surface 110 of the semiconductor substrate. As a consequence, the body region or the mesa between adjacent gate trenches 242 has a varying width as has been discussed above.

Figure 2D:
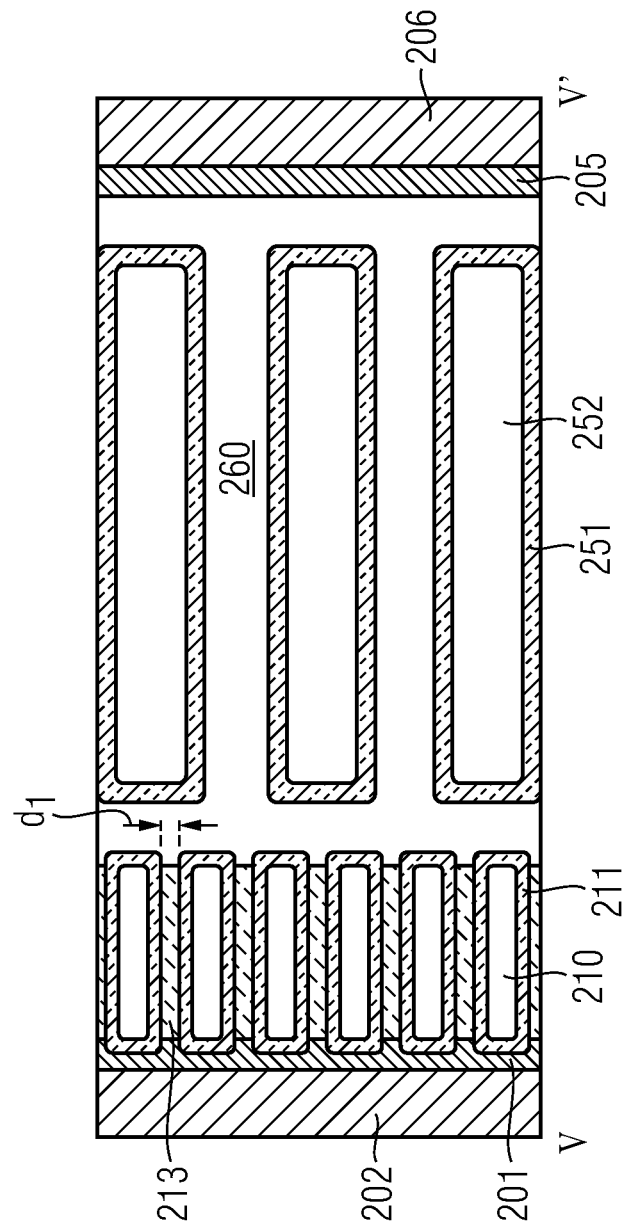
FIG. 2D shows a cross-sectional view of a semiconductor device according to the embodiment of FIG. 2A in another plane parallel to a main surface of a semiconductor substrate.

FIG. 2D shows a cross-sectional view of the semiconductor device in a plane parallel to the main surface of the substrate at a side remote from the main surface 110. The cross-sectional sectional view of FIG. 2D is taken between VI and VI', as is also indicated in FIG. 2C. The cross-sectional view of FIG. 2D is taken to intersect the lower body region 213. The cross-sectional view of FIG. 2D particularly differs from the cross-sectional view of FIG. 2A, since the first width d1 of the body region 213 is smaller than the second width of the upper body region 212 shown in FIG. 2A.

Figure 2E:
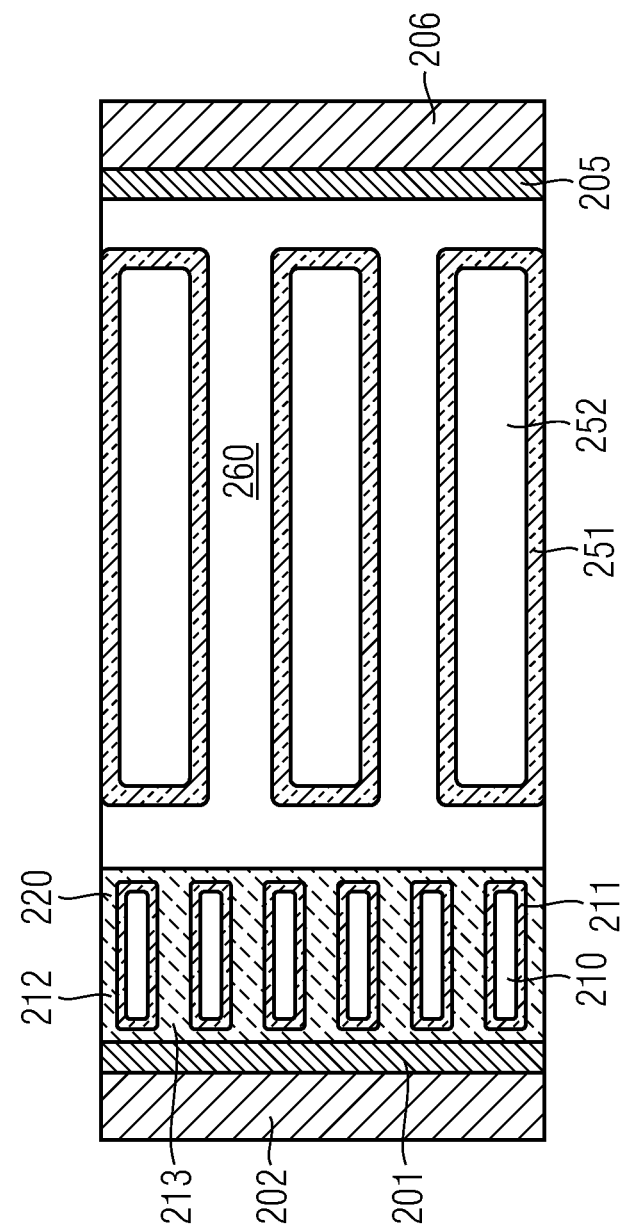
FIG. 2E shows a cross-sectional view of a semiconductor device corresponding to the cross-sectional view of FIG. 2D including a modification.

FIG. 2E shows a further embodiment of a semiconductor device. As is shown in FIG. 2E, differing from the embodiment illustrated in FIG. 2A, the gate electrode does not extend to the right-hand boundary or to the left-hand boundary of the body region 220 along the first direction. In other words, a portion of the upper body region laterally extends beyond the gate electrode. Accordingly, when a suitable gate voltage for switching on the transistor comprising the lower body region is applied to the gate electrode, this portion of the upper body region does not contribute to a current flow from the source region 201 to the drain region 205. As a consequence, the current flow form the source region to the drain region is mainly controlled by the lower portion of the gate electrode. According to this embodiment, when interpreting the conductive channel as a parallel circuit of the upper body region 212 and the lower body region 213, mainly the lower body region 213 contributes to a current flow. Since due to the small width of the lower body region, the lower body region 213 may be fully depleted by applying an appropriate gate voltage to the gate electrode 210, the resulting current voltage characteristics of the semiconductor device may be further improved.

Figure 2F:
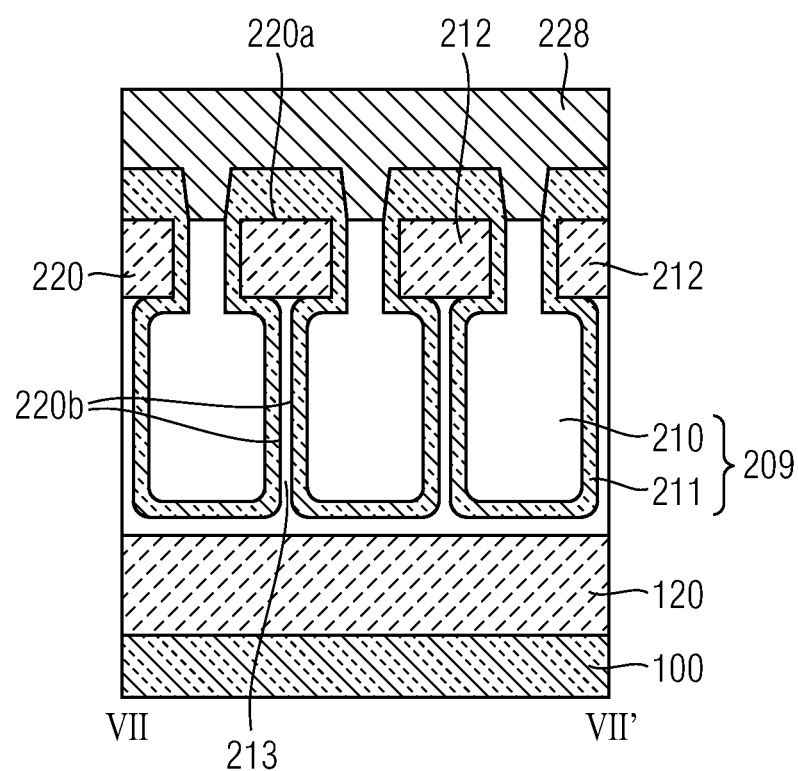
FIG. 2F shows a cross-sectional view of the semiconductor device corresponding to the cross-sectional view of FIG. 2C taken at a different position.

FIG. 2F shows a further cross-sectional view of the semiconductor device which is taken between VII and VII', as is also indicated in FIG. 2A. In FIG. 2F, the same reference numerals designate the same components as shown in FIG. 2C. However, differing from the cross-sectional view illustrated in FIG. 2C, there is a gate conductive line 228 that contacts the respective gate electrodes 210 disposed in the trenches. The gate conductive line 228 may be parallel to the source connection wiring 227.

Figure 2G:
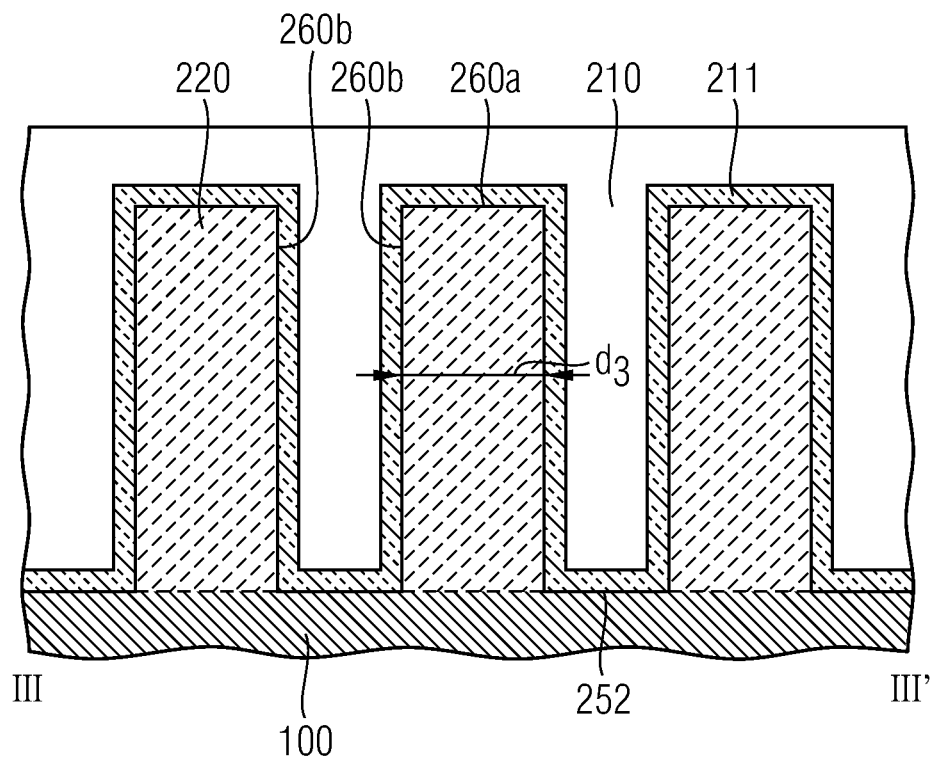
FIG. 2G shows a cross-sectional view of a further portion of the semiconductor device shown in FIG. 2A in a direction perpendicular to the direction of the cross-sectional view of FIG. 2B.

According to embodiments, the drift zone 260 may comprise a flat surface which is not patterned to form ridges. According to a further embodiment, the field plate 250 may be arranged in trenches 252 so that the drift zone 260 comprises ridges. FIG. 2G shows an embodiment of a semiconductor device in which the field plate 210 is arranged in field plate trenches 252. Due to the distance between the field plate trenches 252, the drift zone 260 has a width d3 which is larger than the width d1 or d2 of the body region. Hence, the field plate trenches 252 may be disposed at a larger distance so that the portions of the drift zone 260 which are disposed between adjacent field plate trenches 252, have a larger width. According to another embodiment, d3 may be chosen to be approximately equal to d2. Typically, the thickness of the field dielectric layer between the field plate and the drift zone is thicker than the thickness of the gate dielectric layer to increase the drain-source breakdown voltage. This may result in a greater pitch of the field plate trenches in comparison with the gate trenches.

In order to improve the characteristics of the semiconductor device in the channel region and to further improve the device characteristics in the drift zone, patterning the gate electrode and the field plate may be accomplished using an appropriate etching mask so as to provide a different distance between gate trenches and field plate trenches, respectively.

For example, this may be accomplished by forming a set of gate trenches 242 having a smaller pitch and by forming a set of field plate trenches 252 having a larger pitch. According to an embodiment, the gate trenches 242 and the field plate trenches 252 may be separate from each other. According to a further embodiment, the gate trenches 242 and the field plate trenches 252 may be merged so as to form one single trench having different width. According to a further embodiment, the gate trenches 242 and the field plate trenches 252 may have the same distance. For example, according to this embodiment, field plate trenches 252 may be formed by an anisotropic etching method or by an etching method that has a rather small etching rate in a horizontal direction in comparison to the vertical direction. Further, the gate trenches 242 may be etched using a predominantly anisotropic etching method for defining the upper body region, and using an etching method having a large isotropic component so as to define the widened trench portions. Thereby, the width of the lower body region 213 may be reduced.

The semiconductor devices illustrated in FIGS. 2A to 2G implement lateral power transistors. They may be employed in DC/DC or AC/DC converters since they may be integrated in an easy manner. Further, they may achieve high current densities so that they may be employed for small power and voltages between 10V and several hundred Volts.

The concept explained above may be modified in various ways. For example, the drift zone 260 may be implemented in different manners. Further, the semiconductor device may be implemented without field plates including a conductive filling. For example, the semiconductor device may comprise, for example, a stack of alternating p- and n-doped compensation areas extending in the first direction, as is conventional. Thereby, a compensation device or superjunction device may be implemented. According to still a further embodiment, the drift region may be dispensed with.

Figure 3A:
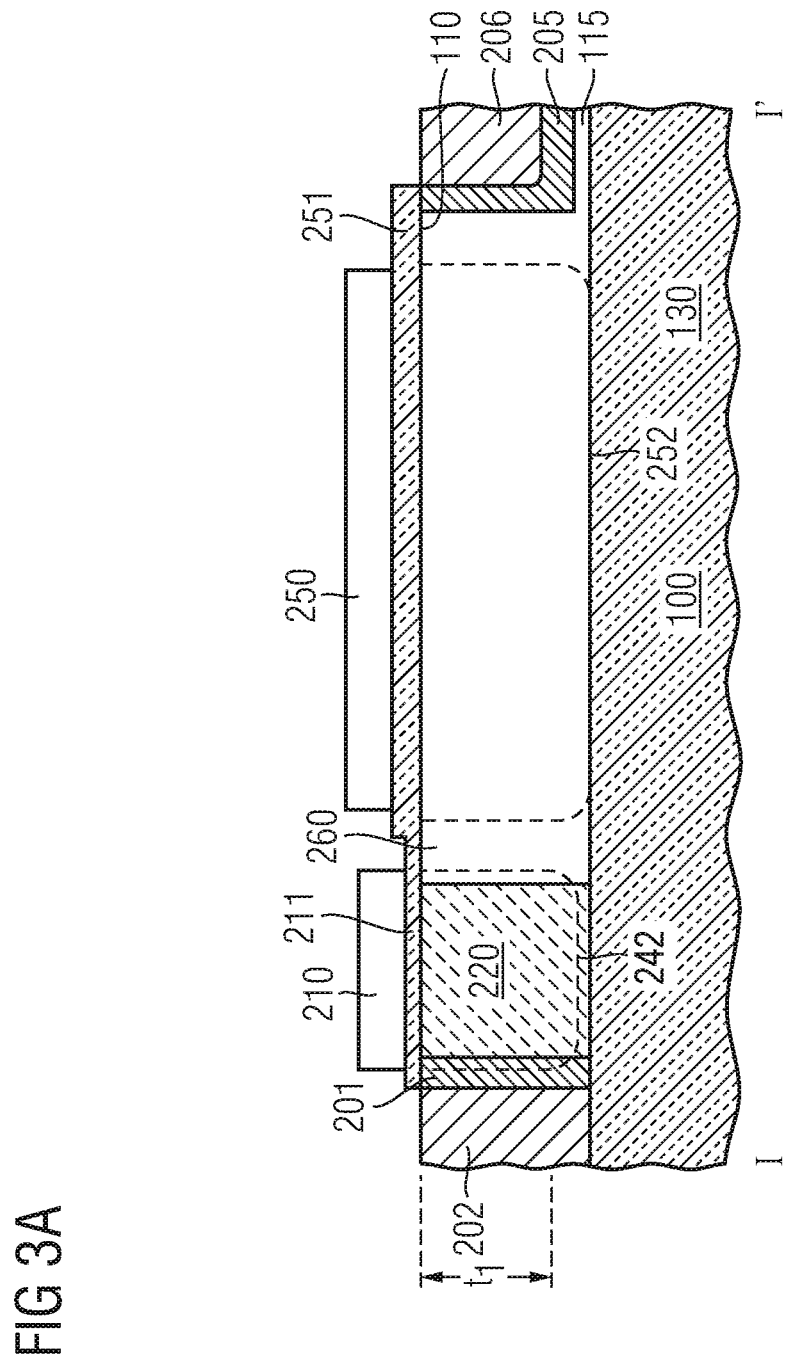
FIG. 3A shows a cross-sectional view of a semiconductor device according to a further embodiment.
Figure 3B:
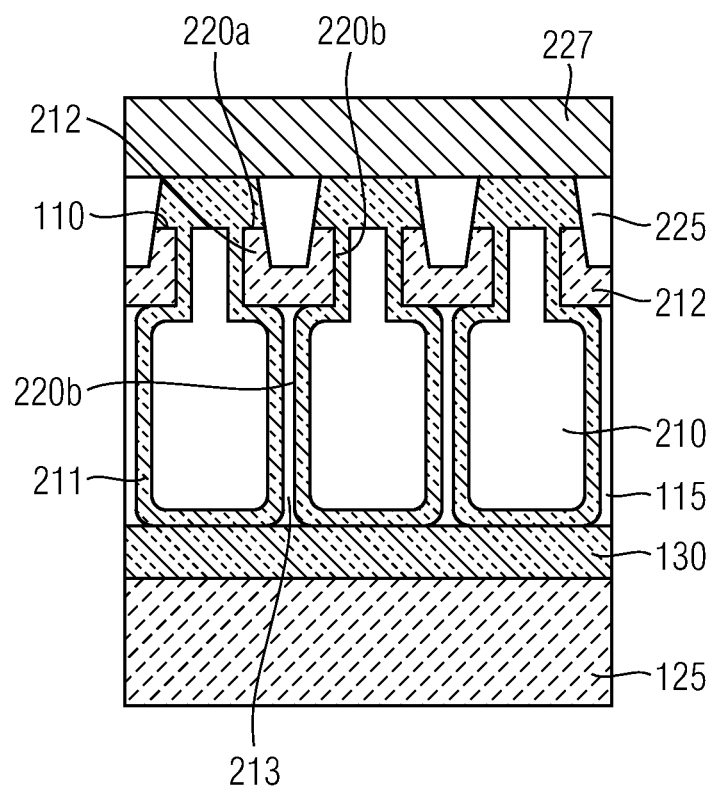
FIG. 3B shows a cross-sectional view of the semiconductor device of FIG. 3A in a direction perpendicular to the direction of the cross-sectional view of FIG. 3A.

FIGS. 3A and 3B illustrate a further embodiment of the semiconductor device according to which the transistor is formed in a SOI ("silicon on insulator") substrate. The SOI substrate comprises a semiconductor layer 115 and a buried oxide layer 130 that are disposed over a substrate base layer 125. The substrate base layer and the semiconductor layer 115 may be doped with appropriate dopants. According to this embodiment, the respective components of the transistor are disposed in the semiconductor layer 115. The gate trenches 242 and, optionally, the field plate trenches 252 may extend to the buried oxide layer 130. In FIGS. 3A and 3B reference numerals designate the same components as in FIGS. 1A to 1D and FIGS. 2A to 2G. Since the semiconductor device according to embodiments comprises body contacts that contact the top side of the body region or the fin, the semiconductor device may be easily implemented using an SOI substrate.

The transistor described refers to a MOSFET ("metal oxide semiconductor field effect transistor"), in which a gate dielectric material such as silicon oxide is disposed between the gate electrode and the channel region. According to a further embodiment, the transistor may be a JFET ("junction field effect transistor") in which the gate electrode is directly adjacent to the channel region, without a gate dielectric material being disposed between the gate electrode and the channel region. According to this embodiment, the channel region may be doped with n-type dopants. The gate electrode may be implemented by p-doped semiconductor material, for example, p-doped polysilicon. Further components of the semiconductor device may be implemented in a manner as has been described above. Further, as is generally known, a semiconductor device usually comprises a plurality of single transistors having the configuration described above. The plurality of single transistors are connected parallel to each other.

The described semiconductor device may be employed in converters, e.g. flyback converters and synchronous buck converters. According to an implementation, the described semiconductor device may be employed in these devices to replace diodes that usually are used in these converters. The described semiconductor device has an improved forward voltage so that as a result losses in the converters are minimized. Hence, embodiments also relate to a converter comprising a semiconductor device as described hereinabove. For example, the converter may comprise a semiconductor device comprising a transistor in a semiconductor substrate including a main surface. The transistor comprises a source region, a drain region, a body region, and a gate electrode structure adjacent to the body region. The source region and the drain region are disposed along a first direction, the first direction being parallel to the main surface. The body region is disposed between the source region and the drain region. The body region comprises an upper body region at the main surface and a lower body region remote from the main surface, a first width of the lower body region being smaller than a second width of the upper body region. The first width and the second width are measured in a direction perpendicular to the first direction. According to a further embodiment, the converter may be a flyback converter or a synchronous buck converter.

Figure 4A:
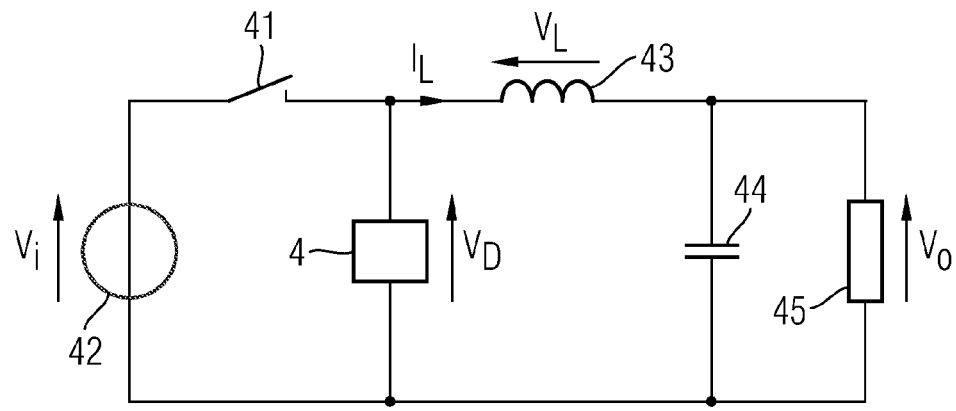
FIGS. 4A and 4B illustrate equivalent circuit diagrams of converters according to embodiments.

FIG. 4A shows an example of an equivalent circuit diagram of a buck converter. As is shown, a buck converter according to an embodiment may comprise a voltage source 42, a switch 41, an inductor 43, a capacitance 44, a resistor 45, and a semiconductor device 4 comprising a transistor according to any embodiment as described hereinabove.

Figure 4B:
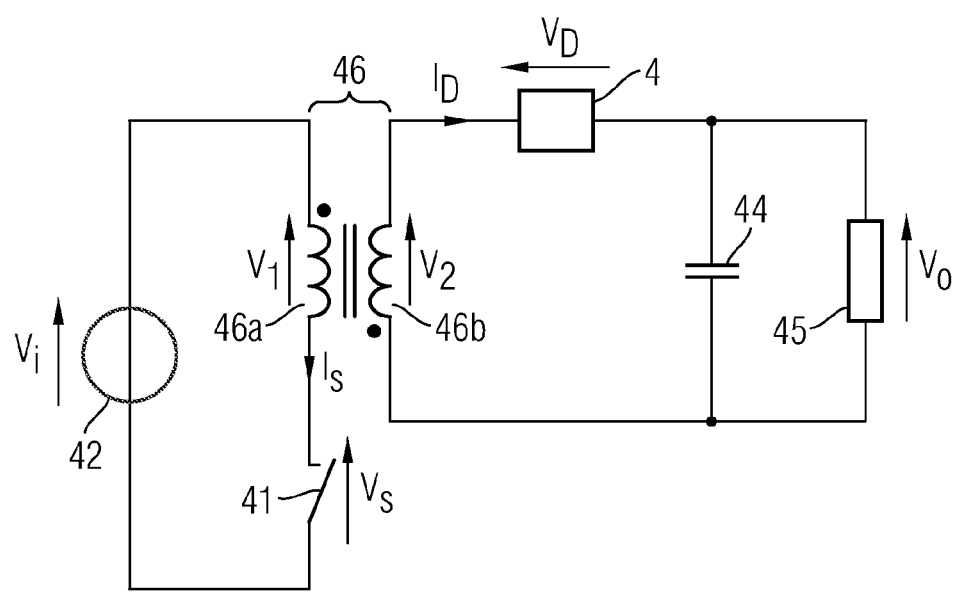

FIG. 4B shows an example of an equivalent circuit diagram of a flyback converter. As is shown, a flyback converter according to an embodiment may comprise a voltage source 42, a switch 41, a capacitance 44, a resistor 45, and a semiconductor device 4 comprising a transistor according to any embodiment as described hereinabove. The flyback converter further comprises an inductor split to a transformer 46 including a primary side 46a, and a secondary side 46b.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A semiconductor device comprising a transistor in a semiconductor substrate including a main surface, the transistor comprising:
   a source region;
   a drain region;
   a body region;
   a gate electrode structure adjacent to the body region; and
   gate trenches in the main surface, the gate trenches extending along a first direction which is parallel to the main surface, the body region being disposed between adjacent ones of the trenches,
   wherein the source region and the drain region are disposed along the first direction,
   wherein the body region is disposed between the source region and the drain region,
   wherein the body region comprises an upper body region at the main surface and a lower body region remote from the main surface, a first width of the lower body region being smaller than a second width of the upper body region, the first width and the second width being measured in a direction perpendicular to the first direction,
   wherein each of the gate trenches comprises an upper trench portion at the main surface and a lower trench portion remote from the main surface, a second width of each of the gate trenches at the upper trench portion being smaller than a first width of each of the gate trenches at the lower trench portion.

2. The semiconductor device of claim 1, wherein:
   the body region has a shape of a fin extending along the first direction; and
   the fin comprises an upper fin portion at the main surface and a lower fin portion remote from the main surface, the upper fin portion having the second width and the lower fin portion having the first width.

3. The semiconductor device of claim 2, wherein the fin comprises upper sidewalls defining the upper fin portion and lower sidewalls defining the lower fin portion and a conductive channel is formed along the lower sidewalls in an on-state.

4. The semiconductor device of claim 2, wherein:

$$s1/d1 > 2.0,$$

wherein s1 denotes the length of the fin measured along the first direction and d1 denotes the first width of the lower fin portion.

5. The semiconductor device of claim 1, wherein for the first width d1 of the lower body region:

$$d1 \leq 2 \times l_d,$$

wherein $l_d$ denotes a maximum length of a depletion zone formed at an interface between the lower body region and a gate dielectric being a component of the gate electrode structure, the maximum length of the depletion zone corresponding to a length of the depletion zone at a gate voltage corresponding to a threshold voltage of the transistor.

6. The semiconductor device of claim 1, further comprising a drift zone between the body region and the drain region.

7. The semiconductor device of claim 6, further comprising a field plate adjacent to the drift zone, the field plate being arranged in field plate trenches in the main surface.

8. The semiconductor device of claim 7, wherein a distance between field plate trenches is larger than the first width of the lower body region.

9. The semiconductor device of claim 1, wherein the upper body region adjacent to an upper fin portion laterally extends beyond the gate electrode structure.

10. The semiconductor device of claim 1, further comprising a body contact portion in contact with the upper body region, the body contact portion being electrically coupled to a source terminal.

11. The semiconductor device of claim 10, wherein the body contact portion has a contact width larger than the first width of the lower body region.

12. An integrated circuit comprising the semiconductor device of claim 1.

13. A semiconductor device comprising a transistor in a semiconductor substrate including a main surface, the transistor comprising:
   a source region;
   a drain region;
   a plurality of gate trenches in the main surface, each gate trench extending along a first direction which is parallel to the main surface and having a narrow top portion at the main surface and a wider bottom portion remote from the main surface,
   a plurality of body regions, each body region extending along the first direction disposed between adjacent gate trenches and having a narrow bottom part defined by the wider bottom portions of adjacent gate trenches and a wider upper part defined by narrow top portions of adjacent gate trenches, each body region including a channel region;
   a gate electrode structure adjacent to each body region; and
   a body contact portion in contact with each body region,
   wherein the source region and the drain region are disposed along the first direction,
   wherein each body region is further disposed between the source region and the drain region,
   wherein the body contact portion contacts the wider upper part.

14. The semiconductor device of claim 13, wherein the body contact portion is disposed on a side of the main surface of the semiconductor substrate.

15. The semiconductor device of claim 13, wherein the body contact portion is electrically coupled to a source terminal.

16. The semiconductor device of claim 13, wherein the channel region is disposed adjacent to the narrow bottom part.

17. A semiconductor device comprising a transistor in a semiconductor substrate including a main surface, the transistor comprising:
   a source region;
   a drain region;
   a body region; and
   a gate electrode structure adjacent to the body region,
   wherein the source region and the drain region are disposed along a first direction which is parallel to the main surface,
   wherein the body region is disposed between the source region and the drain region,
   wherein the body region comprises an upper body region at the main surface and a lower body region remote from the main surface, a first width of the lower body region being smaller than a second width of the upper body region, the first width and the second width being measured in a direction perpendicular to the first direction,
   wherein a concentration of dopants of the upper body region is higher than a concentration of dopants of the lower body region,
   wherein the upper and lower body regions have a same width in the first direction.

* * * * *